United States Patent
Su et al.

(10) Patent No.: US 6,667,222 B1
(45) Date of Patent: Dec. 23, 2003

(54) METHOD TO COMBINE ZERO-ETCH AND STI-ETCH PROCESSES INTO ONE PROCESS

(75) Inventors: Bin-Jia Su, Kaohsiung (TW); Eric Sun, Hsin-Chu (TW); Jacky Chen, Kaohsiung (TW); Johnson Peng, Chu-Pei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/038,387

(22) Filed: Jan. 3, 2002

(51) Int. Cl.⁷ .................................. H01L 21/76
(52) U.S. Cl. ................. 438/424; 438/401; 438/427
(58) Field of Search ........................ 438/424, 401, 438/427, 975, 462, 456

(56) References Cited

U.S. PATENT DOCUMENTS

| | | | |
|---|---|---|---|
| 5,270,265 A | * 12/1993 | Hemmenway et al. | 438/424 |
| 5,536,675 A | 7/1996 | Bohr | 437/67 |
| 5,646,063 A | * 7/1997 | Mehta et al. | 438/424 |
| 5,786,260 A | 7/1998 | Jang et al. | 438/401 |
| 5,893,744 A | 4/1999 | Wang | 438/401 |
| 5,950,093 A | 9/1999 | Wei | 438/401 |
| 6,015,744 A | * 1/2000 | Tseng | 438/401 |
| 6,043,133 A | 3/2000 | Jang et al. | 438/401 |
| 6,049,137 A | 4/2000 | Jang et al. | 257/797 |
| 6,440,816 B1 | * 8/2002 | Farrow et al. | 438/401 |
| 6,444,573 B1 | * 9/2002 | Wang et al. | 438/638 |
| 6,461,937 B1 | * 10/2002 | Kim et al. | 438/431 |

* cited by examiner

*Primary Examiner*—Michael Trinh
(74) *Attorney, Agent, or Firm*—George O. Saile; Stephen B. Ackerman; Rosemary L. S. Pike

(57) ABSTRACT

A method for integrating the zero-etch and STI-etch processes into one process is described. An etch stop layer is deposited on a substrate. A mask is formed overlying the etch stop layer having a first opening for a planned alignment mark and having a second opening for a planned shallow trench isolation region. The etch stop layer is etched away within the first and second openings and the semiconductor substrate exposed within the first and second openings is etched into a first depth to form a first trench underlying the first opening and a second trench underlying the second opening. The first trench is covered and the second trench is etched into the semiconductor substrate to a second depth greater than the first depth. The second trench is filled to complete formation of a shallow trench isolation region wherein the first trench completes formation of an alignment mark in the fabrication of an integrated circuit device.

17 Claims, 5 Drawing Sheets

METHOD TO COMBINE ZERO-ETCH AND STI-ETCH PROCESSES INTO ONE PROCESS

BACKGROUND OF THE INVENTION

(1) Field of the Invention

The present invention relates to the fabrication of integrated circuit devices, and more particularly, to a method of forming both alignment marks and shallow trench isolation (STI) in one process in the fabrication of integrated circuits.

(2) Description of the Prior Art

In the manufacture of integrated circuits, layers of various materials are grown or deposited on underlying layers. Many of these layers are patterned using lithographic processes. In order for the completed integrated circuit to operate properly, the patterned layers must be aligned precisely with one another. One lithographic technique that is common in the art is the use of a stepper to image portions of a wafer progressively until the entire wafer has been processed. Alignment marks are formed on the wafer and used by the stepper to align the mask properly with previous layers.

The formation of alignment marks within the semiconductor substrate is called the zero-etch process. In this process, typically, an oxide layer is grown over the surface of the semiconductor substrate. A photoresist layer is patterned to leave an opening for an alignment mark. The oxide layer and the semiconductor substrate are etched within the opening to a depth of about 1200 Angstroms. The mask and oxide are removed to complete formation of the alignment mark.

Shallow trench isolation (STI) is often used in the fabrication of integrated circuits to separate active areas from one another. In the STI-etch process, a pad oxide layer is grown over the semiconductor substrate a silicon nitride layer is typically deposited over the pad oxide layer. A photoresist layer is patterned to leave an opening for a STI trench. The nitride layer, pad oxide layer, and the semiconductor substrate are etched within the opening to a depth of about 3500 Angstroms. The trench is filled with an insulating layer and planarized. The nitride and pad oxide layers are removed to complete formation of the STI. It is desired to integrate the zero-etch and STI-etch processes into one process in order to save process steps.

U.S. Pat. No. 5,786,260 and 6,049,137 to Jang et al and U.S. Pat. No. 6,043,133 to Jang et al disclose the formation of alignment marks, followed by deposition of pad oxide and silicon nitride layers, and then simultaneous formation of STI trenches and trenches at the periphery of the alignment mark area. U.S. Pat. No. 5,950,093 to Wei teaches first forming an alignment mark, then etching an STI trench and extending the alignment mark trench to make it deeper than the STI trench. U.S. Pat. No. 5,893,744 to Wang etches STI trenches and alignment mark trenches sequentially and then fills both trenches in one step. U.S. Pat. No. 5,536,675 to Bohr teaches etching both shallow and deep trenches where a mask opening over the deep trench allow it to be etched deeper without etching into the shallow trench. None of these references combines the zero-etch and STI-etch processes into one process without adding masking or other steps.

SUMMARY OF THE INVENTION

Accordingly, the primary object of the invention is to provide a process for integrating the zero-etch and STI-etch processes into one process in the fabrication of integrated circuits.

A further object of the invention is to provide a process for forming an alignment mark and shallow trench isolation simultaneously.

In accordance with the objects of the invention, a method for integrating the zero-etch and STI-etch processes into one process is achieved. An etch stop layer is provided on a semiconductor substrate. A mask is formed overlying the etch stop layer having a first opening for a planned alignment mark and having a second opening for a planned shallow trench isolation region. The etch stop layer is etched away within the first and second openings and the semiconductor substrate exposed within the first and second openings is etched into a first depth to form a first trench underlying the first opening and a second trench underlying the second opening. The first trench is covered and the second trench is etched into the semiconductor substrate to a second depth greater than the first depth. The second trench is filled to complete formation of a shallow trench isolation region wherein the first trench completes formation of an alignment mark in the fabrication of an integrated circuit device.

BRIEF DESCRIPTION OF THE DRAWINGS

In the accompanying drawings forming a material part of this description, there is shown:

FIGS. 1 through 6 are cross-sectional representations of a preferred embodiment of the present invention.

DESCRIPTION OF THE PREFERRED EMBODIMENTS

The process of the present invention combines two major process modules into one, thus saving many process steps, time, and expense. Combined are the processes to form the "zero" alignment mark, which is formed within the semiconductor substrate, and shallow trench isolation.

Figure 1:
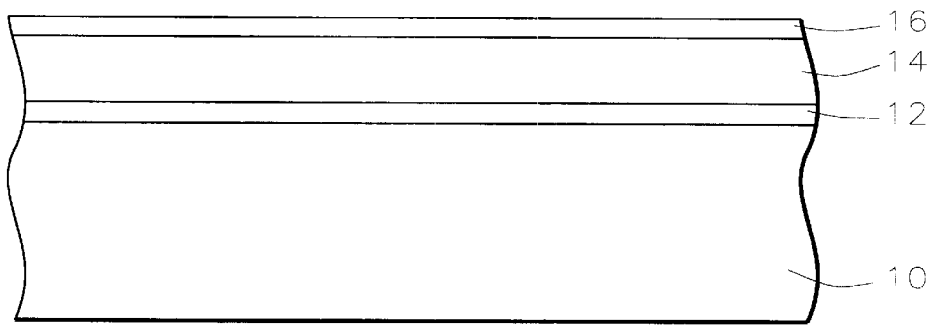

Referring now more particularly to FIG. 1, there is shown a semiconductor substrate 10, preferably composed of monocrystalline silicon. Pad oxide layer 12 is grown on the surface of the semiconductor substrate to a thickness of between about 100 and 120 Angstroms, and preferably about 110 Angstroms. An etch stop layer 14, such as silicon nitride, is deposited over the pad oxide layer to a thickness of between about 1450 and 1800 Angstroms, and preferably about 1625 Angstroms. Optionally, an anti-reflective coating (ARC) material layer 16, such as silicon oxynitride, may be deposited over the silicon nitride layer 14 to a thickness of between about 290 and 350 Angstroms, and preferably about 320 Angstroms.

Figure 2:
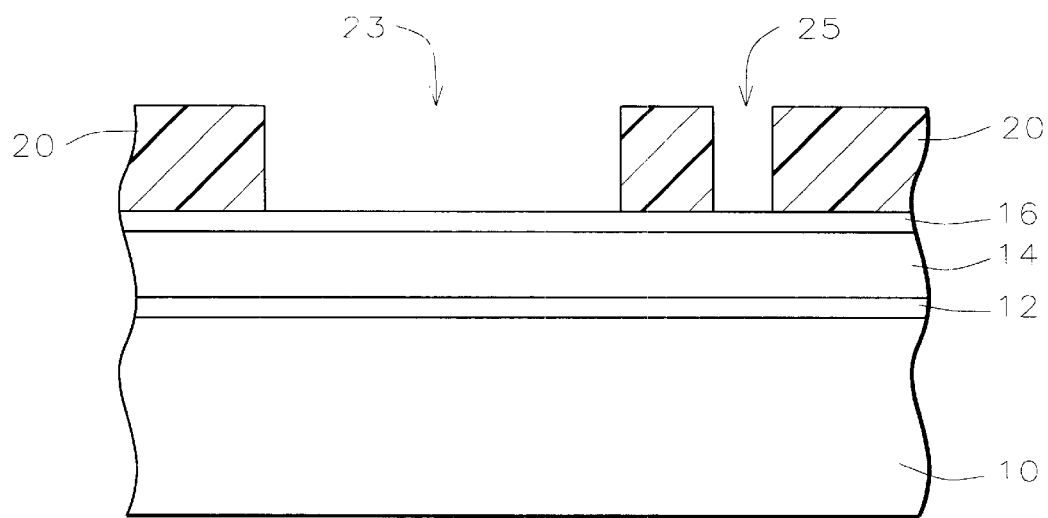

A photoresist mask 20 is formed over the surface of the ARC layer, as shown in FIG. 2, or over the nitride layer surface if the ARC layer is not used. Openings are provided (23) where an alignment mark is to be formed and (25) where a shallow trench isolation region is to be formed.

Figure 3:
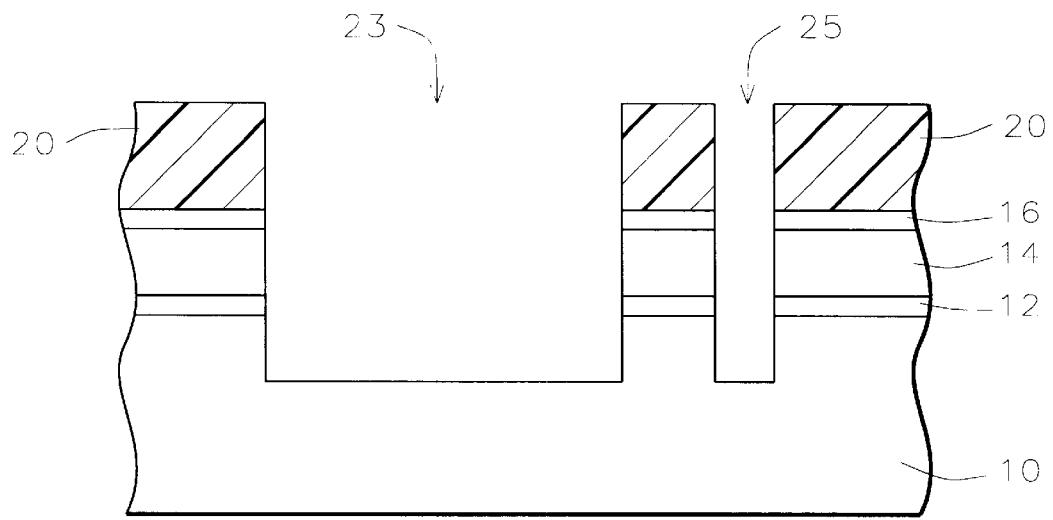

Referring now to FIG. 3, using conventional photolithography and etching techniques, the ARC layer, silicon nitride layer, and pad oxide layer are etched away within the openings. The semiconductor substrate 10 exposed within the openings is etched into to a depth of between about 1100 and 1300 Angstroms, and preferably about 1200 Angstroms, to form alignment mark 23 and partial STI trench 25.

Figure 4A:
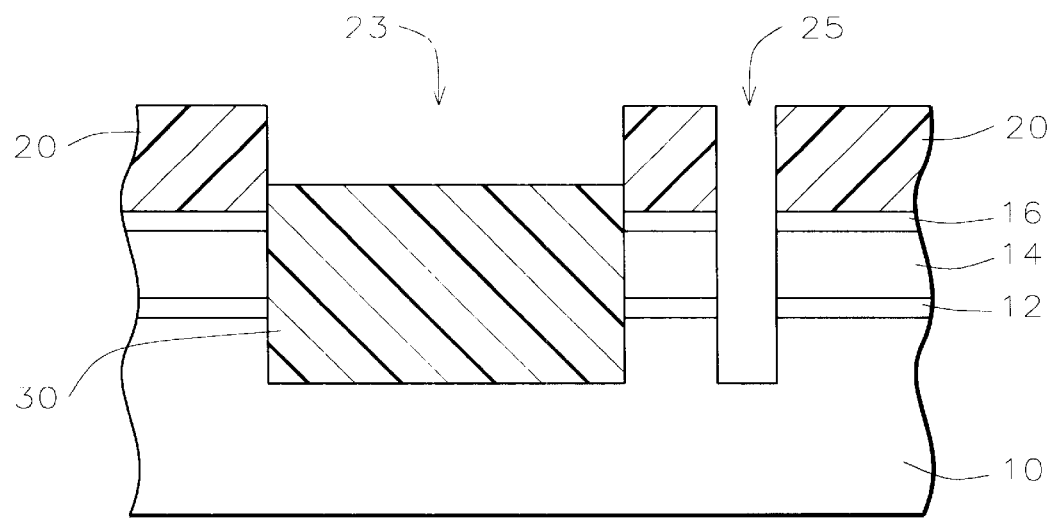
FIGS. 4A and 5A are cross-sectional representations of a first alternative in a preferred embodiment of the present invention.

This completes formation of the alignment mark 23. Now the STI trench is to be etched deeper. The alignment mark is covered so that it will be unaffected by the STI trench etch. In one alternative, shown in FIG. 4A, a the wafer is transferred to a buffer chamber for local photoresist coating. A layer of photoresist 30 or other material is coated over the substrate so that the alignment mark 23 is partially filled with the photoresist layer 30. The photoresist layer is deposited to a thickness of between about 8000 and 10,000 Angstroms. The alignment trench is within the alignment mark area. The photoresist layer 30 is coating on the alignment mark area only by means of a local injector, for example. No exposure, development, or patterning of the photoresist layer is performed.

Figure 4B:
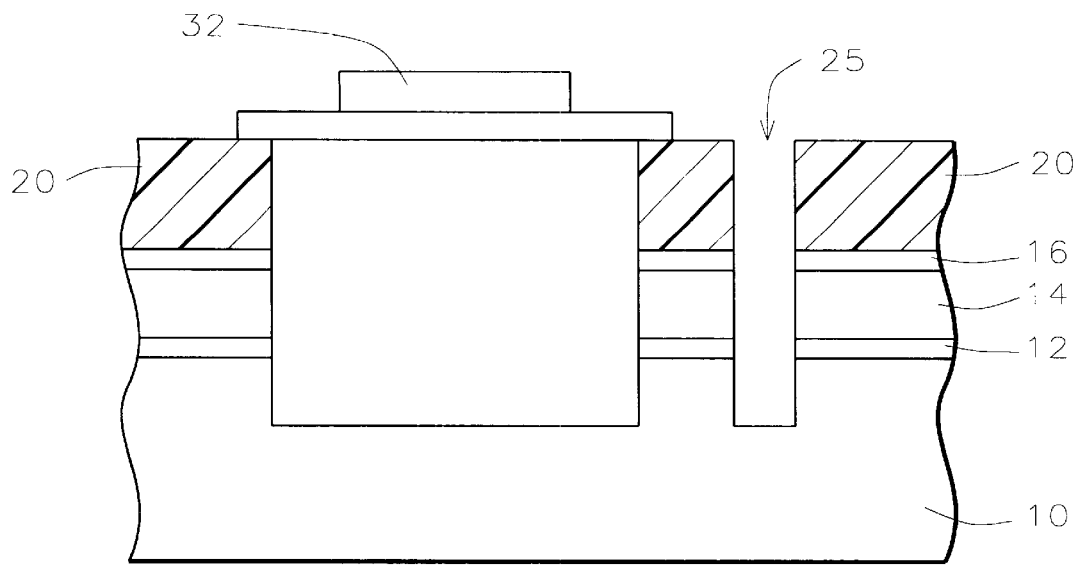
FIGS. 4B and 5B are cross-sectional representations of a second alternative in a preferred embodiment of the present invention.

In a second alternative, illustrated in FIG. 4B, a solid cover such as a clamp 32 covers the alignment mark. For example, the clamp may be of a ceramic material.

Figure 5A:
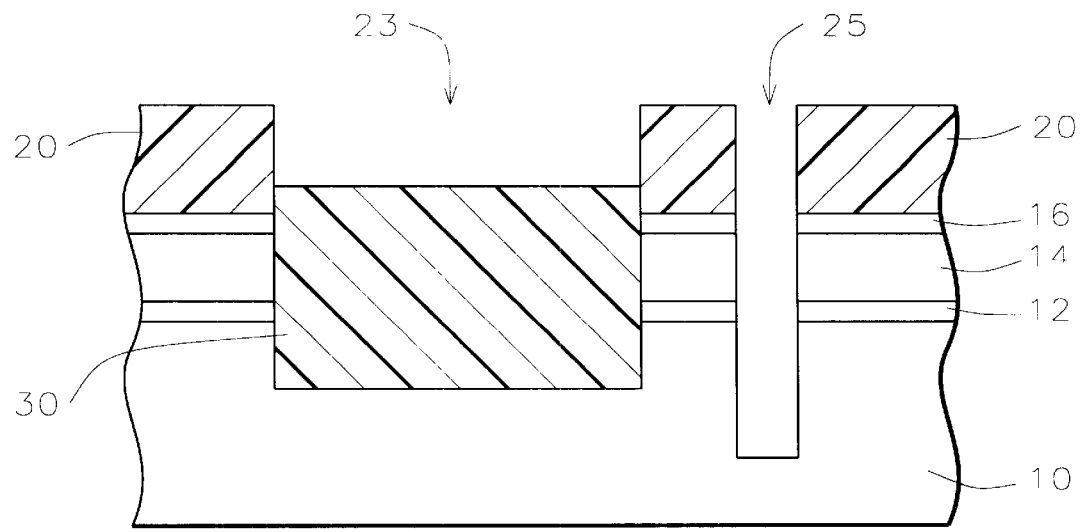
Figure 5B:
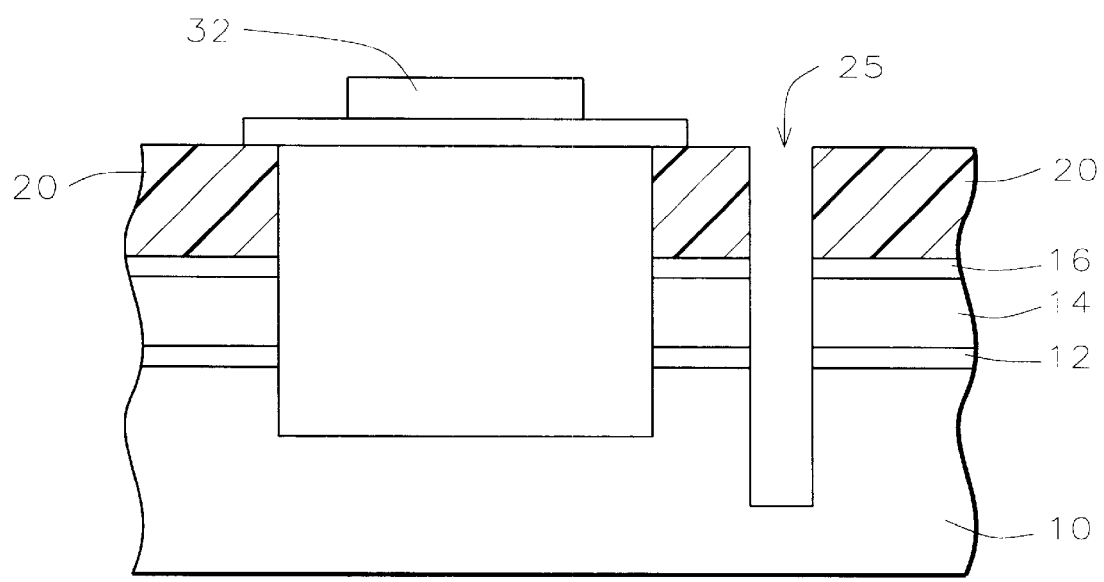

Now, the STI trench 25 not covered by the photoresist 30 (FIG. 5A) or the clamp 32 (FIG. 5B) is etched again to a total depth within the semiconductor substrate of between about 3300 and 3700 Angstroms, and preferably about 3500 Angstroms, to complete the STI trench.

Figure 6:
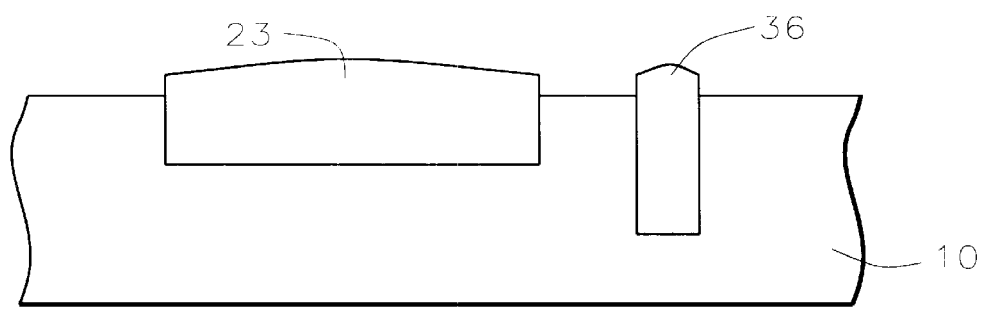

After a conventional cleaning step, the alignment mark and STI trench are filled with an oxide layer. Optionally, a layer of liner oxide, not shown, could be grown within the trench by thermal oxidation to a thickness of between about 150 and 250 Angstroms. This liner oxide can round the sharp corners of the trench. Then, an oxide layer 36 is deposited by chemical vapor deposition (CVD) or high density plasma (HDP) CVD, for example, over the surface of the substrate and filling the trenches. The oxide layer 36 is polished using CMP with a polish stop at the silicon nitride layer 14. The nitride layer 14 and pad oxide layer 12 are removed as is conventional in the art, resulting in FIG. 6.

In the first alternative, the photoresist 30 and the photoresist mask 20 are removed such as by ashing or photoresist stripping. In the second alternative, the clamp is removed and the photoresist mask 20 is stripped.

The process of the present invention saves many process steps as well as time and expense by combining the zero-etch process of forming an alignment mark with the STI-etch process.

Figure 7:
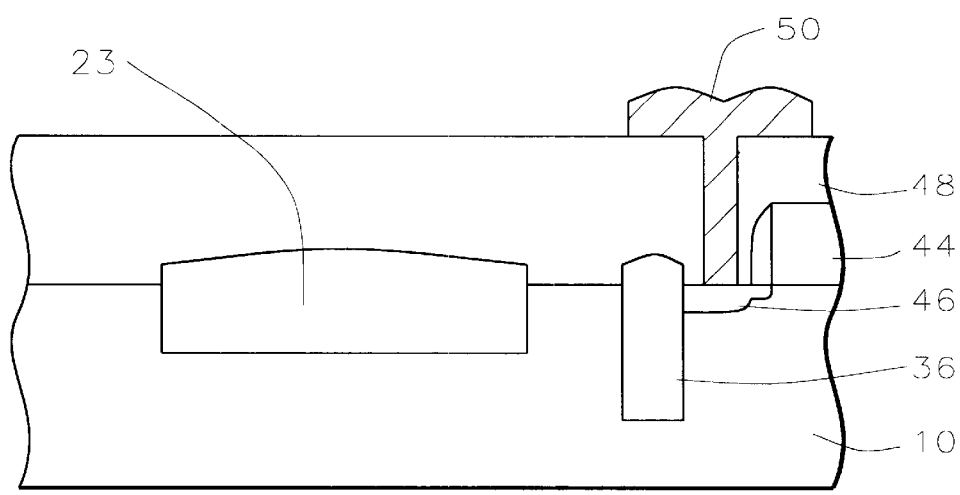
FIG. 7 is a cross-sectional representation of a completed integrated circuit device fabricated by the process of the present invention.

Processing continues as is conventional in the art. For example, as shown in FIG. 7, gate electrodes 44 and source and drain regions 46 may be formed in the active regions between STI regions 36 as is conventional in the art. Electrical contacts 50 may be made through dielectric isolation layer 48. Alignment mark 23 is used to align the various masks used in further processing, such as patterning gate electrodes and contact openings, and so on. The process of the present invention results in the simultaneous formation of alignment marks and shallow trench isolation (STI), saving processing time and expense.

While the invention has been particularly shown and described with reference to the preferred embodiments thereof, it will be understood by those skilled in the art that various changes in form and details may be made without departing from the spirit and scope of the invention.

What is claimed is:

1. A method of forming an alignment mark and a shallow trench isolation region in the fabrication of an integrated circuit device comprising:

providing an etch stop layer on a substrate;

forming a photoresist mask overlying said etch stop layer having a first opening for a planned said alignment mark and having a second opening for a planned said shallow trench isolation region;

etching away said etch stop layer within said first and second openings and etching into said substrate exposed within said first and second openings to a first depth to form a first trench underlying said first opening and a second trench underlying said second opening;

thereafter covering said first trench with a solid cover placed on said photoresist mask, and etching said second trench into said substrate to a second depth greater than said first depth; and removing said solid cover and said photoresist mask and filling said second trench to complete formation of said shallow trench isolation region wherein said first trench completes formation of said alignment mark in the fabrication of said integrated circuit device.

2. The method according to claim 1 further comprising forming a pad oxide layer underlying said etch stop layer and having a thickness of between about 100 and 120 Angstroms.

3. The method according to claim 1 wherein said etch stop layer comprises silicon nitride having a thickness of between about 1450 and 1800 Angstroms.

4. The method according to claim 1 further comprising depositing an anti-reflective coating layer overlying said etch stop layer.

5. The method according to claim 1 wherein said first depth is between about 1100 and 1300 Angstroms.

6. The method according to claim 1 wherein said solid cover is a clamp.

7. The method according to claim 1 wherein said second depth is between about 3300 and 3700 Angstroms.

8. The method according to claim 1 wherein said step of filling said second trench comprises:

depositing an oxide layer over said etch stop layer and within said second trench;

polishing away said oxide layer with a polish stop at said etch stop layer to leave said oxide layer within said second trench; and removing said etch stop layer to complete said filling of said second trench.

9. A method of forming an alignment mark and a shallow trench isolation region in the fabrication of an integrated circuit device comprising:

providing a pad oxide layer on a substrate;

depositing an etch stop layer overlying said pad oxide layer; depositing an anti-reflective coating layer overlying said etch stop layer;

forming a photoresist mask overlying said anti-reflective coating layer having a first opening for a planned said alignment mark and having a second opening for a planned said shallow trench isolation region;

etching away said anti-reflective coating layer, said etch stop layer, and said pad oxide layer within said first and second openings and etching into said substrate exposed within said first and second openings to a first depth to form a first trench underlying said first opening and a second trench underlying said second opening;

thereafter covering said first trench wherein said step of covering comprises locally coating a photoresist material to partially fill said first trench wherein said photoresist material is not exposed or developed or placing a solid cover placed on said photoresist mask to cover said first trench and etching said second trench into said substrate to a second depth greater than said first depth; and removing said photoresist material or said solid cover and said photoresist mask and filling said second trench to complete formation of said shallow trench isolation region wherein said first trench completes formation of said alignment mark in the fabrication of said integrated circuit device.

10. The method according to claim 9 wherein said etch stop layer comprises silicon nitride having a thickness of between about 1450 and 1800 Angstroms.

11. The method according to claim 9 wherein said anti-reflective coating layer comprises silicon oxynitride having a thickness of between about 290 and 350 Angstroms.

12. The method according to claim 9 wherein said first depth is between about 1100 and 1300 Angstroms.

13. The method according to claim 9 wherein said solid cover is a clamp.

14. The method according to claim 9 wherein said second depth is between about 3300 and 3700 Angstroms.

15. A method of forming an alignment mark and a shallow trench isolation region in the fabrication of an integrated circuit device comprising:

providing an etch stop layer on a substrate;

forming a photoresist mask overlying said etch stop layer having a first opening for a planned said alignment mark and having a second opening for a planned said shallow trench isolation region;

etching away said etch stop layer within said first and second openings and etching into said substrate exposed within said first and second openings to a first depth to form a first trench underlying said first opening and a second trench underlying said second opening;

thereafter covering said first trench wherein said step of covering comprises locally coating a photoresist material to partially fill said first trench wherein said photoresist material is not exposed or developed or placing a solid cover placed on said photoresist mask to cover said first trench;

thereafter etching said second trench into said substrate to a second depth greater than said first depth; and removing said photoresist material or said solid cover and said photoresist mask and filling said second trench to complete formation of said shallow trench isolation region wherein said first trench completes formation of said alignment mark in the fabrication of said integrated circuit device.

16. The method according to claim 15 wherein said solid cover comprises a clamp.

17. The method according to claim 15 wherein said first depth is between about 1100 and 1300 Angstroms and wherein said second depth is between about 3300 and 3700 Angstroms.

* * * * *